(12) United States Patent
Yeh et al.

(10) Patent No.: US 6,515,428 B1
(45) Date of Patent: Feb. 4, 2003

(54) PIXEL STRUCTURE AN ORGANIC LIGHT-EMITTING DIODE DISPLAY DEVICE AND ITS MANUFACTURING METHOD

(75) Inventors: Yung-Hui Yeh, Hsinchu (TW); Wen-Chun Wang, Taichung (TW); Chai-Yuan Sheu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 161 days.

(21) Appl. No.: 09/722,126

(22) Filed: Nov. 24, 2000

(51) Int. Cl.[7] .............................. G09G 3/10; H01J 1/62; G02F 1/1335
(52) U.S. Cl. .................. 315/169.3; 315/169.4; 313/489; 313/504; 349/106; 349/104; 349/108
(58) Field of Search ................. 315/169.3, 169.4, 315/169.1; 313/489, 491, 504, 500, 498; 349/108, 106, 104

(56) References Cited

U.S. PATENT DOCUMENTS 5,402,141 A * 3/1995 Haim et al. .................... 345/88
5,550,066 A 8/1996 Tang et al. .................... 437/40
5,910,829 A * 6/1999 Shimada et al. ............ 349/106
6,365,916 B1 * 4/2002 Zhong et al. .................. 257/59

* cited by examiner

Primary Examiner—Don Wong
Assistant Examiner—Tuyet T. Vo

(57) ABSTRACT

A pixel structure of an active matrix full-color OLED display device and its manufacturing method are provided. The pixel structure of the display device comprises two thin film transistors, a storage capacitor, a color filter, and an OLED device structure constructed on a top surface of a substrate, a black matrix region outside the color filter region and under the thin film transistors. In this pixel, structure of the OLED display device, the OLED device structure and the color filter are integrated in a thin-film-transistor array. This simplifies the process, reduces the leakage of light and increases the contrast of the display device. A white OEL device is used to emit light. A light then passes a color filter to get red, green or blue color of light. Therefore, a full-color OLED is formed. A poly-silicon thin film transistor is used to provide current to the OLED device structure and served as an active drive device. The advantages of the display device include simple fabrication process, high-resolution, high lighting efficiency and wide viewing angle.

8 Claims, 16 Drawing Sheets

US 6,515,428 B1

PIXEL STRUCTURE AN ORGANIC LIGHT-EMITTING DIODE DISPLAY DEVICE AND ITS MANUFACTURING METHOD

FIELD OF THE INVENTION

The present invention relates generally to a pixel structure of an organic light-emitting diode (OLED) display device and its manufacturing method, and more particularly to a pixel structure of an active matrix full-color OLED display device and its manufacturing method.

BACKGROUND OF THE INVENTION

Flat panel displays have become one of the most important electronic products such as notebook computers and pocket-TVs. Among the flat panel displays, organic electroluminescent (OEL) displays have the following advantages: light emitting, high luminous efficiency, wide viewing angle, fast response speed, high reliability, full color, low-voltage drive, low power consumption and simple fabrication process. Undoubtedly, this product has emerged as the display of choice in the market place. The structure and the manufacturing method of a conventional OEL display device of full color are summarized as follows:

(a) using precision photo-mask to get the pixel array of red, green, and blue (RGB) colors in a small molecules system, (b) using color filter to get the pixel array of RGB colors on an OEL device of white light, (c) using light converting layer to convert the original blue or purple light into other colors of light on an OEL device of blue or purple light, (d) making medium stacking layers of various thickness to convert original wide-band light spectrum to RGB colors by the principles of the reflection and the interference of the light, and (e) stacking devices of RGB colors on the same pixel element on a two-side transparent OEL device.

Although a conventional passive OEL display device has lower fabrication cost and simple process, its resolution is not high. It can only make a display device of small size and low resolution. However, an active drive, such as thin-film-transistor (TFT), OLED has characteristics of high resolution and low power consumption. Generally speaking, active drive technique is a major trend for high resolution and high display quality. As the needs for a display device of larger size and higher resolution, an active matrix OLED display device of full color becomes a major trend in the market.

U.S. Pat. No. 5,550,066 discloses a process for making a pixel structure of a thin-film-transistor organic electroluminescent display device. FIG. 1a and FIG. 1b show respectively a diagrammatic plan view and a cross-sectional view of this conventional TFT-OEL device. As shown in FIG. 1a, the pixel structure of a TFT-OEL device 100 comprises mainly two thin film transistors 101 and 102, a storage capacitor 103, and a light emitting OEL pad 104 arranged on a substrate. The TFT 101 is the switching transistor with the source bus 105 as the data line and the gate bus 106 as the gate line. The ground bus 107 is located above the gate bus 106 and below the storage capacitor 103. The source electrode of the TFT 101 is electrically connected to a source bus and the gate electrode comprises a portion of a gate bus. The OEL pad 104 is electrically connected to the drain of the TFT 102. The drain of the TFT 101 is electrically connected to the gate electrode of the TFT 102, which in turn is electrically connected to the storage capacitor 103. The TFT-OEL devices are typically pixel units that are formed into a flat panel display.

FIG. 1b is a cross-sectional view, illustrating the process of forming a pixel structure of this conventional TFT-OEL device. As shown in FIG. 1b, a polysilicon layer is deposited over a transparent and insulating substrate 111 and the polysilicon layer is patterned into a polysilicon island 118. Next, a first insulating gate layer 112 is deposited over the polysilicon island 118 and over the surface of the insulating substrate 111. A layer of silicon 114 is deposited over the gate insulator layer 112 and patterned by photolithography over the polysilicon island 118, such that, after ion implantation source and drain regions are formed in the polysilicon island 118. Ion implantation is conducted with N-type dopants. A gate bus 116 is applied and patterned on the insulating gate layer 112, and then a second insulating layer 113 is applied over the entire surface of the device. Contact holes are cut in the second insulating layer 113 and electrode materials are applied to form contacts with the thin-film-transistors. The electrode material attached to the source region of TFT 102 also forms the top electrode 122 of the storage capacitor 103. A source bus and a ground bus are also formed over the second insulating layer 113. In contact with the drain region of TFT 102 is the anode 136 for the OEL material. Then, an insulating passivation layer 124 is deposited over the surface of the device. The passivation layer 124 is etched leaving a tapered edge. The OEL layer 132 is then deposited over the passivation layer 124 and the anode layer 136. Finally, a cathode electrode layer 134 is deposited over the surface of the device.

There are still some difficulties to overcome for an organic electroluminescent display device of full-color in order to occupy the market of flat panel displays. For instance, it is lot easy to produce a display device of high resolution, high luminous efficiency and wide viewing angle. For example, the driver circuit becomes more complicated and more expensive to achieve the need of high resolution. The brightness and luminous efficiency are not good enough for an OEL device that employs small molecules as its organic material. Although an OEL device using polymer as its organic material has three colors of red, green and blue, its overall brightness and luminous efficiency are even worse than those of OEL device using small molecules as its organic material. Also, the materials employed in the OEL device are not compatible with photolithography. Therefore, it is necessary to develop a simple and efficient manufacturing method and structure for an organic light-emitting display device of full color.

SUMMARY OF THE INVENTION

The present invention has been made to overcome the above-mentioned drawbacks of a conventional organic light-emitting display device. The primary object of the invention is to provide a pixel structure of an active matrix OLED display device of full color. The pixel structure of the active matrix OLED display device of full color comprises mainly a color filter, two thin film transistors, a black matrix, a storage capacitor, and an OLED device structure constructed on a substrate. In this pixel structure of the OLED display device, the OLED device structure and the color filter are integrated in a thin-film-transistor array. This simplifies the fabricating process.

Another object of the invention is to provide a manufacturing method for the pixel structure of the full color and active-matrix OLED display device. The processing steps for the pixel structure are (a) the black matrix process, (b) the buffer layer process, (c) the island process (d) the gate process, (e) the interlayer process, (f) the metal layer process, (g) the passivation layer process, (h) the color filter process, (i) the transparent layer deposition process, and (j) the OLED deposition process.

According to the invention, the light path of the active matrix OLED display device of full color is as follows.

Since the top metal layer is opaque, a light emitted from the OLED layer transmits downward, passes the transparent layer and the color filter, and finally traverses the transparent substrate. Therefore, a black matrix is added outside the color filter region and on the bottom surface of a thin film transistor in order to reduce the leakage of light and increase the contrast of the display device.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIG. 4 is a cross-sectional view taken along the line B-B' in FIG. 2 illustrating the black matrix process of the full-color OLED display device according to the invention.

FIG. 5 is a cross-sectional view taken along the line B-B' in FIG. 2 illustrating the buffer layer process of the full-color OLED display device according to the invention.

FIG. 6 is a cross-sectional view taken along the line B-B' in FIG. 2 illustrating the island process of the full-color OLED display device according to the invention.

FIG. 7 is a cross-sectional view taken along the line B-B' in FIG. 2 illustrating the gate process of the full-color OLED display device according to the invention.

FIG. 8 is a cross-sectional view taken along the line B-B' in FIG. 2 illustrating the interlayer process of the full-color OLED display device according to the invention.

FIG. 9 is a cross-sectional view taken along the line B-B' in FIG. 2 illustrating the metal layer process of the full-color OLED display device according to the invention.

FIG. 10 is a cross-sectional view taken along the line B-B' in FIG. 2 illustrating the passivation layer process of the full-color OLED display device according to the invention.

FIG. 11 is a cross-sectional view taken along the line B-B' in FIG. 2 illustrating the color filter process of the full-color OLED display device according to the invention.

FIG. 12 is a cross-sectional view taken along the line B-B' in FIG. 2 illustrating the transparent layer deposition process of the full-color OLED display device according to the invention.

DETAILED DESCRIPTION OF THE PREFERRED EMBODIMENTS

Figure 2:
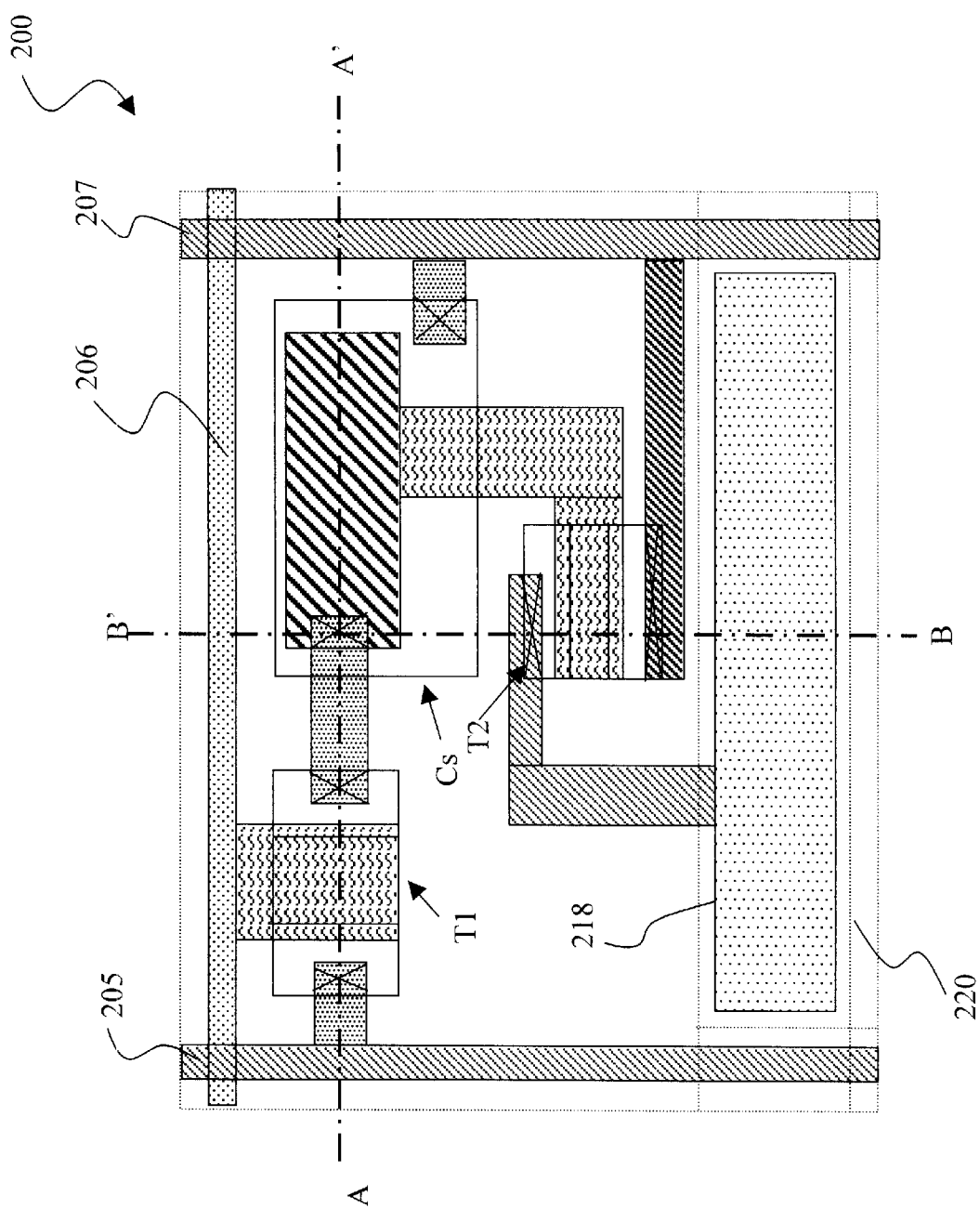
FIG. 2 is a diagrammatic plan view of a full-color, active matrix OLED display device according to the invention.

FIG. 2 is a diagrammatic plan view of an active matrix OLED display device of full color according to the invention. Every pixel structure 200 of the active matrix OLED display device of full color comprises mainly two thin film transistors $T_1$ and $T_2$, a storage capacitor $C_s$, a color filter 212, an OLED device structure 218 constructed on the top surface 214 of a substrate 210, and a black matrix region 220 outside the color filter region 212 and under the thin film transistor $T_2$. Both thin film transistors $T_1$ and $T_2$ comprise respectively a source electrode, a drain electrode and a gate electrode. The gate electrode of the TFT $T_1$ comprises a portion of a gate line. The source electrode of the TFT $T_1$ is electrically connected to a data line and the drain electrode is electrically connected to the gate electrode of the TFT $T_2$. The gate electrode of the TFT $T_2$ is electrically connected to the storage capacitor $C_s$. The OLED device structure 218 is electrically connected to the drain electrode of the TFT $T_2$. Referring to FIG. 2, the TFT $T_2$ is connected in series with the OLED device structure 218 and the TFT $T_1$ is connected in series with the storage capacitor $C_s$. The OLED device structure 218 is connected to the top surface 214 of an insulating substrate 210, such as a glass substrate. The black matrix region 220 is deposited over the top surface 214 of the insulating substrate. The TFT $T_1$ is the switching transistor with the data busline 205 as the data line, the gate busline 206 as the gate line and $V_{dd}$ bus 207 as the power supply bus.

In the preferred embodiments, a poly-silicon thin film transistor is used to provide current to the OLED device structure 218 and to serve as an active drive device. The OLED device structure 218 employs white organic light-emitting diodes or polymer light-emitting diodes as the electroluminescent media.

Figure 3:
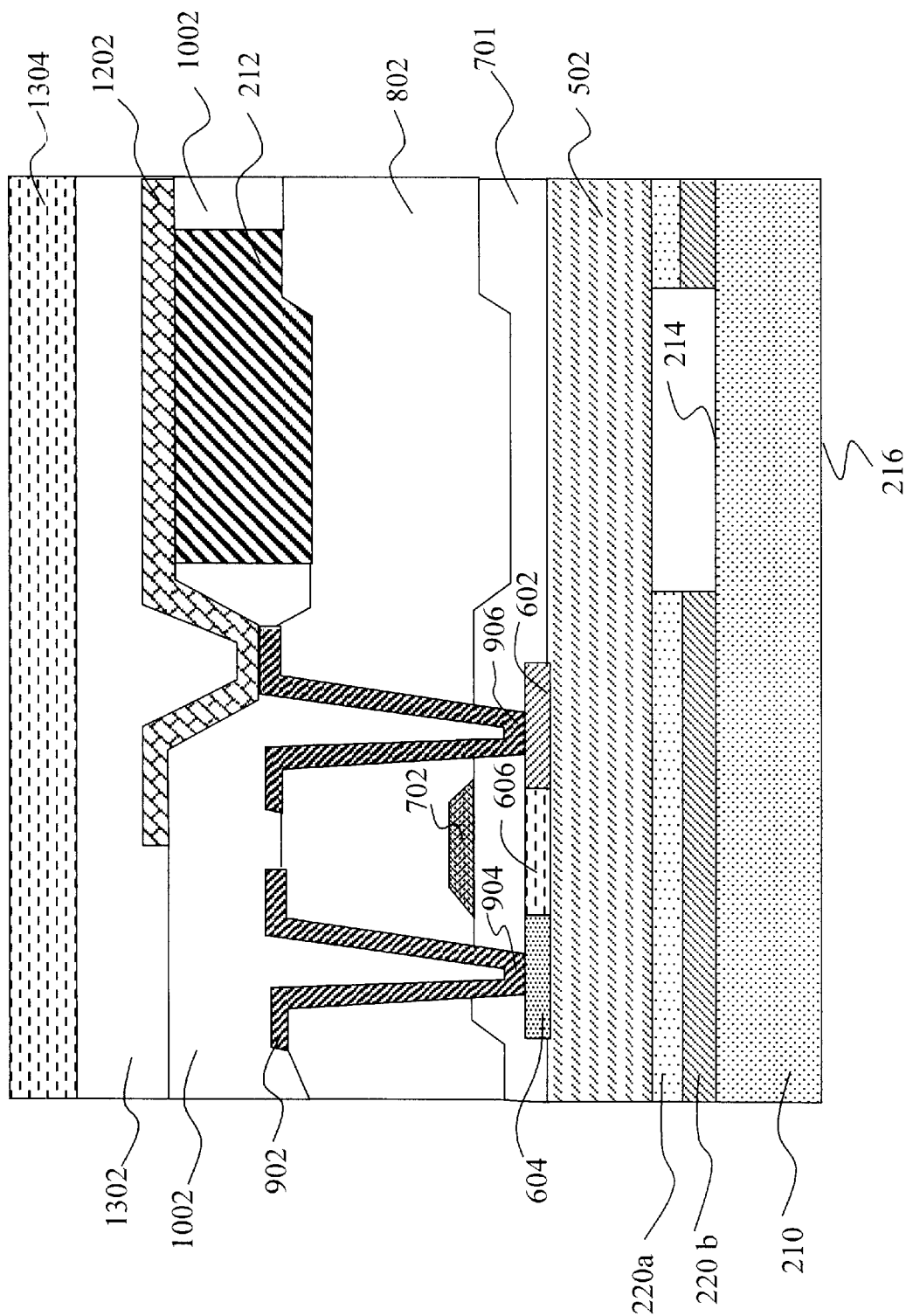
FIG. 3 is a cross-sectional view taken along the line B-B' in FIG. 2.
Figure 14:
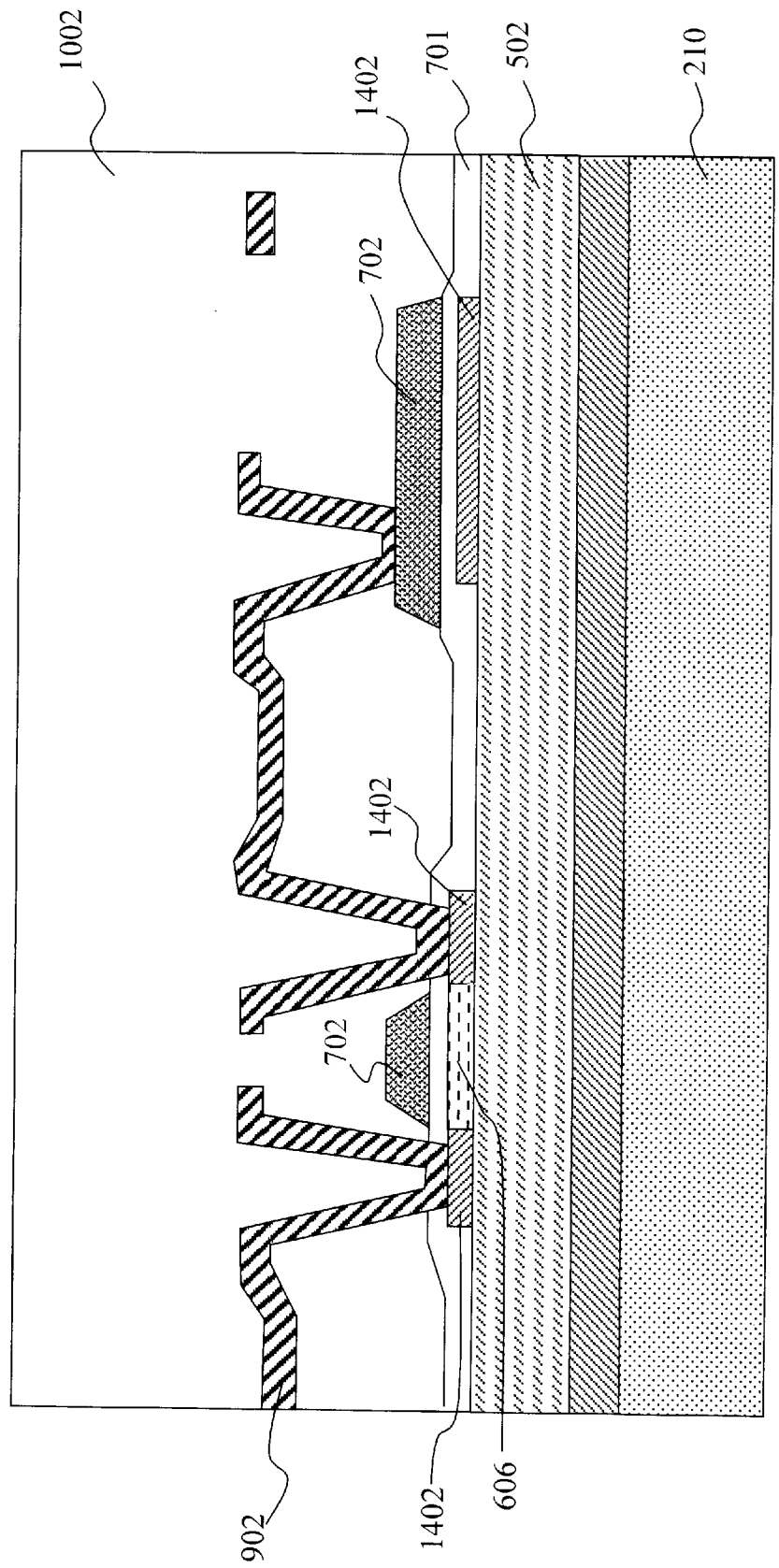
FIG. 14 is a cross-sectional view taken along the line A-A' in FIG. 2.

FIG. 3 is a cross-sectional view taken along the line B-B' in FIG. 2. FIG. 2 and FIG. 3 show the pixel structure of the OLED display device of the invention. FIGS. 4 to 12 are cross-sectional views taken along the line B-B' in FIG. 2 illustrating sequentially every fabrication step of a pixel structure of an OLED display device according to the invention. FIG. 14 is a cross-sectional view taken along the line A-A' in FIG. 2.

As mentioned before, the processing steps for the pixel structure of the OLED display device of the invention are (a) the black matrix process, (b) the buffer layer process, (c) the island process, (d) the gate process, (e) the interlayer process, (f) the metal layer process, (g) the passivation layer process, (h) the color filter process, (i) the transparent layer deposition process, and (j) the OLED deposition process.

Figure 4A:
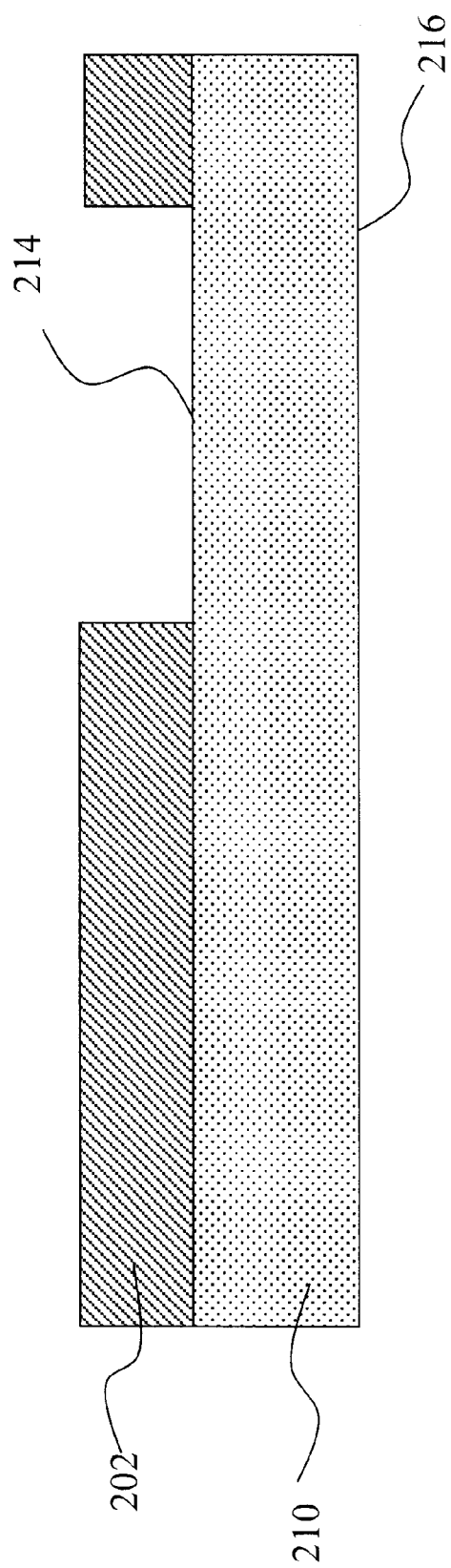
FIGS. 4 to 12 are cross-sectional views taken along the line B-B' in FIG. 2 illustrating sequentially every fabricating step of a pixel structure of an OLED display device according to the invention.
Figure 4B:
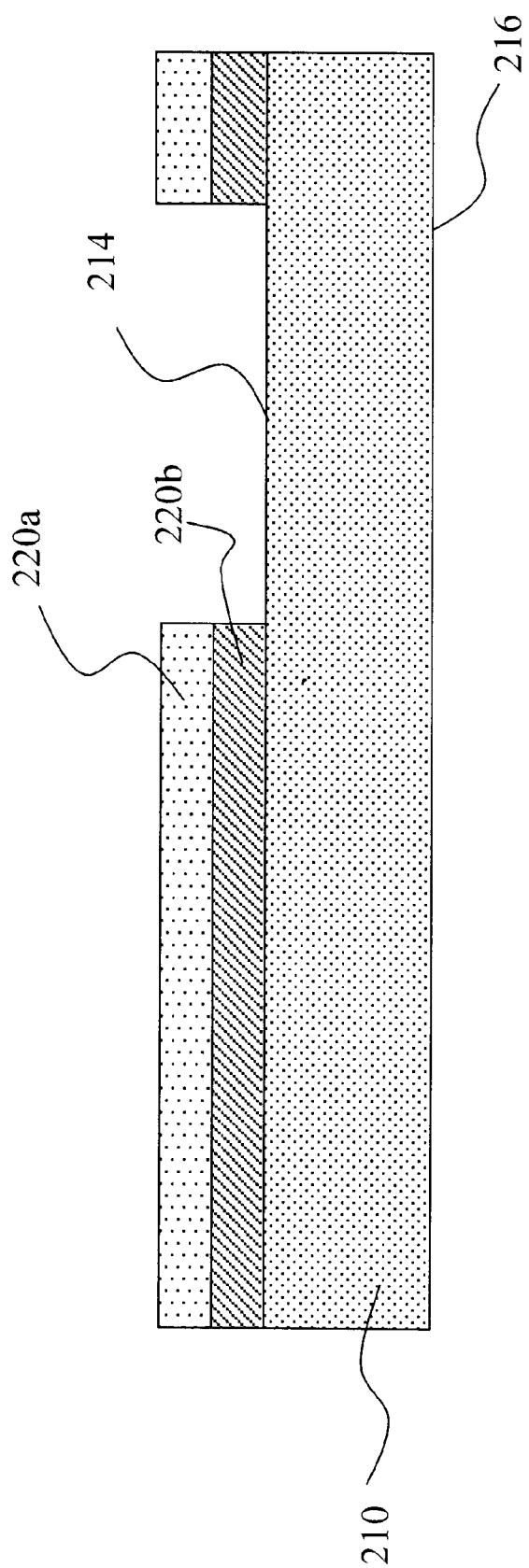

FIG. 4 is a cross-sectional view taken along the line B-B' in FIG. 2 illustrating the black matrix process of the full-color OLED display device according to the invention. In this process, an insulating substrate 210 having a top surface 214 and a bottom surface 216 is provided. A black matrix region 220 is deposited and defined on the top surface 214 of the insulating substrate 210, as shown in FIG. 4a. The black matrix region further comprises a metal layer, such as a chromic (Cr) metal layer 220a, and a chromium oxide (CrOx) layer 220b (or black resin), as shown in FIG. 4b.

Figure 5:
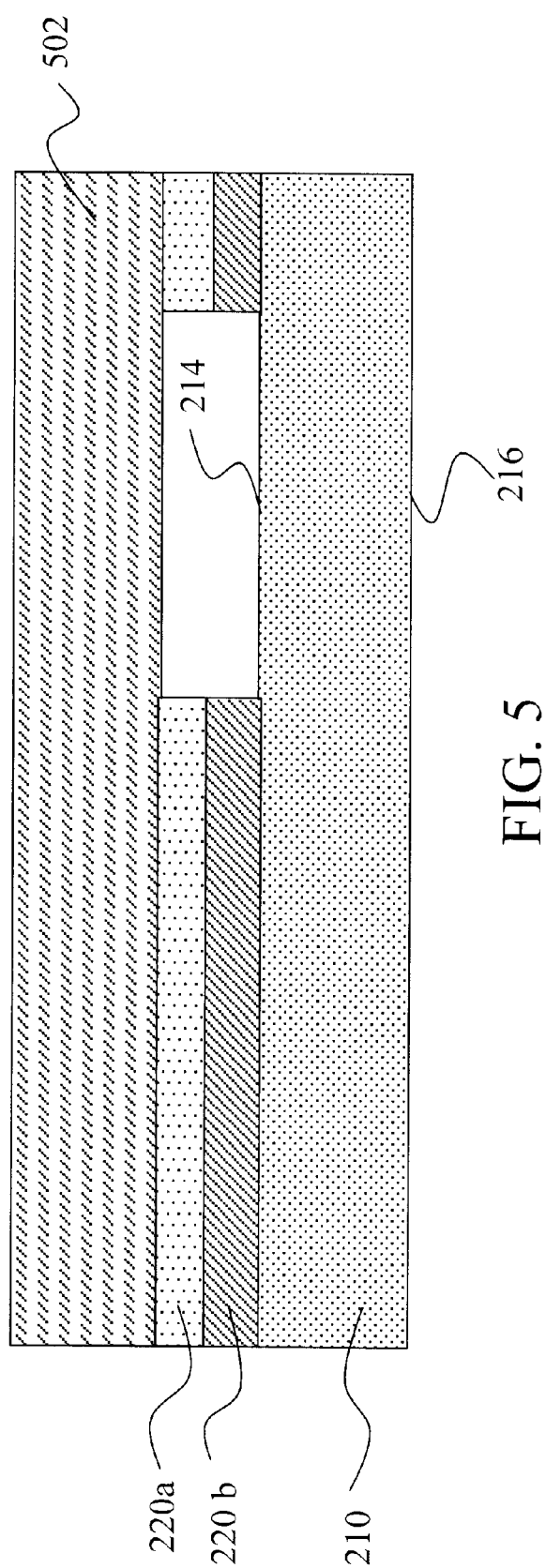

Then, a buffer layer 502 is deposited over the black matrix region 220, as shown in FIG. 5.

Figure 6:
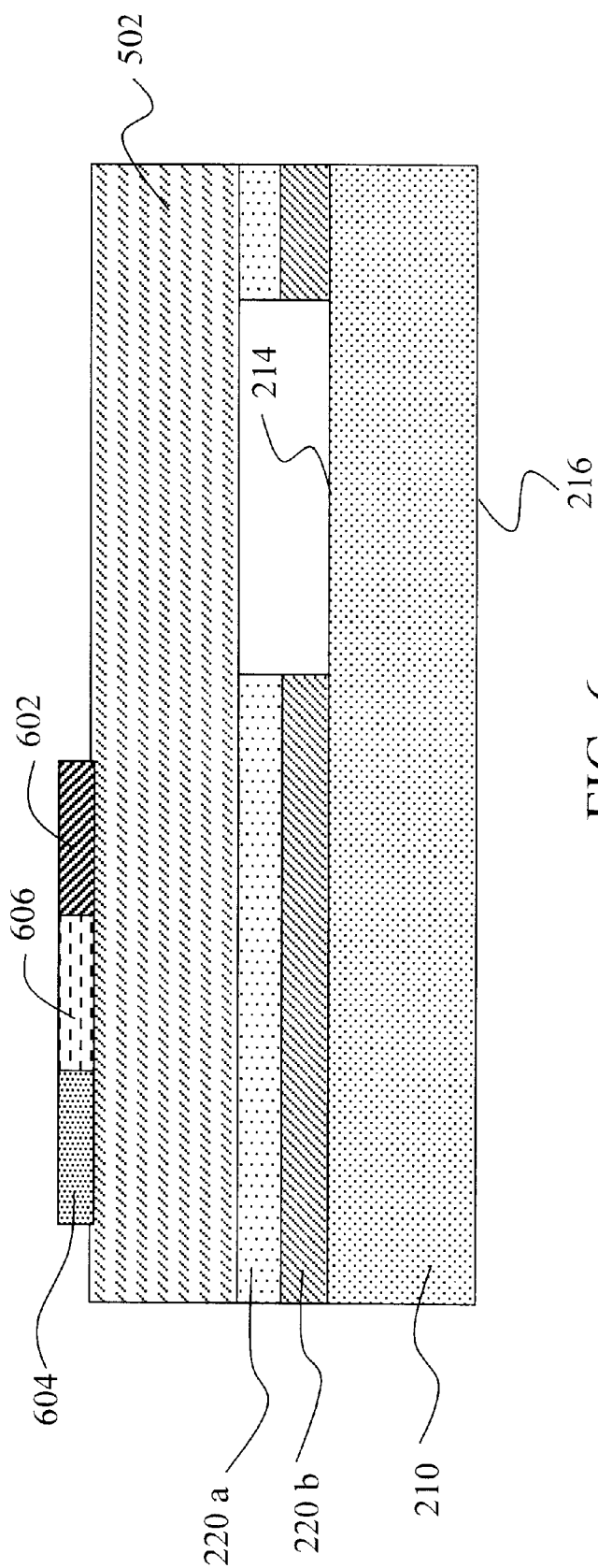

FIG. 6 is a cross-sectional view taken along the line B-B' in FIG. 2 illustrating the island process. In this process, a poly-si layer 606 is deposited over the buffer layer 502 to define source and drain electrode regions of the TFT $T_1$ and define source and drain electrode regions of the TFT $T_2$. FIG. 6 shows only the source electrode region 604 and the drain electrode region 602 of the TFT $T_2$. Then, a polycrystalline silicon island is formed and defined by laser crystallization and etching method, as shown in FIG. 6.

In the embodiment of the present invention, the source and drain electrode regions of the TFT $T_1$ are formed after ion implantation and are conducted with N+type dopants over the electrodes. The source and drain electrode regions of the TFT $T_2$ are conducted with P+type dopants over the electrodes.

Figure 7:
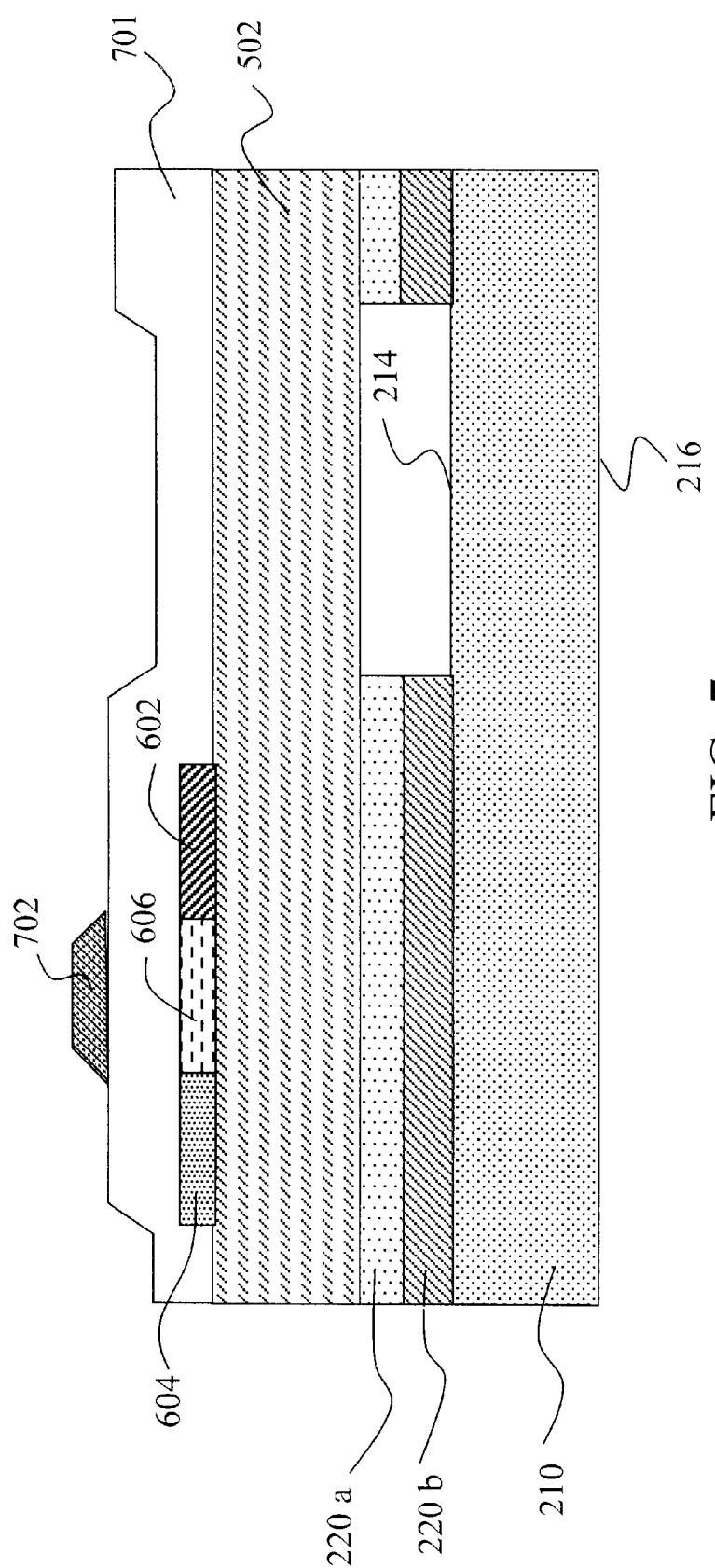

FIG. 7 is a cross-sectional view taken along the line B-B' in FIG. 2 illustrating the gate process of the full-color OLED display device according to the invention. In this process, electrode materials are deposited over the polycrystalline silicon island to form a gate layer. In the preferred embodiment, gate oxides and gate metal are deposited respectively over the polycrystalline silicon island to form respectively a gate oxide layer 701 and a gate metal layer 702. Then the gate layer is defined, including gate electrodes of thin film transistors $T_1$ and $T_2$. FIG. 7 shows only the gate electrode 702 of the thin film transistor $T_2$.

Figure 8:
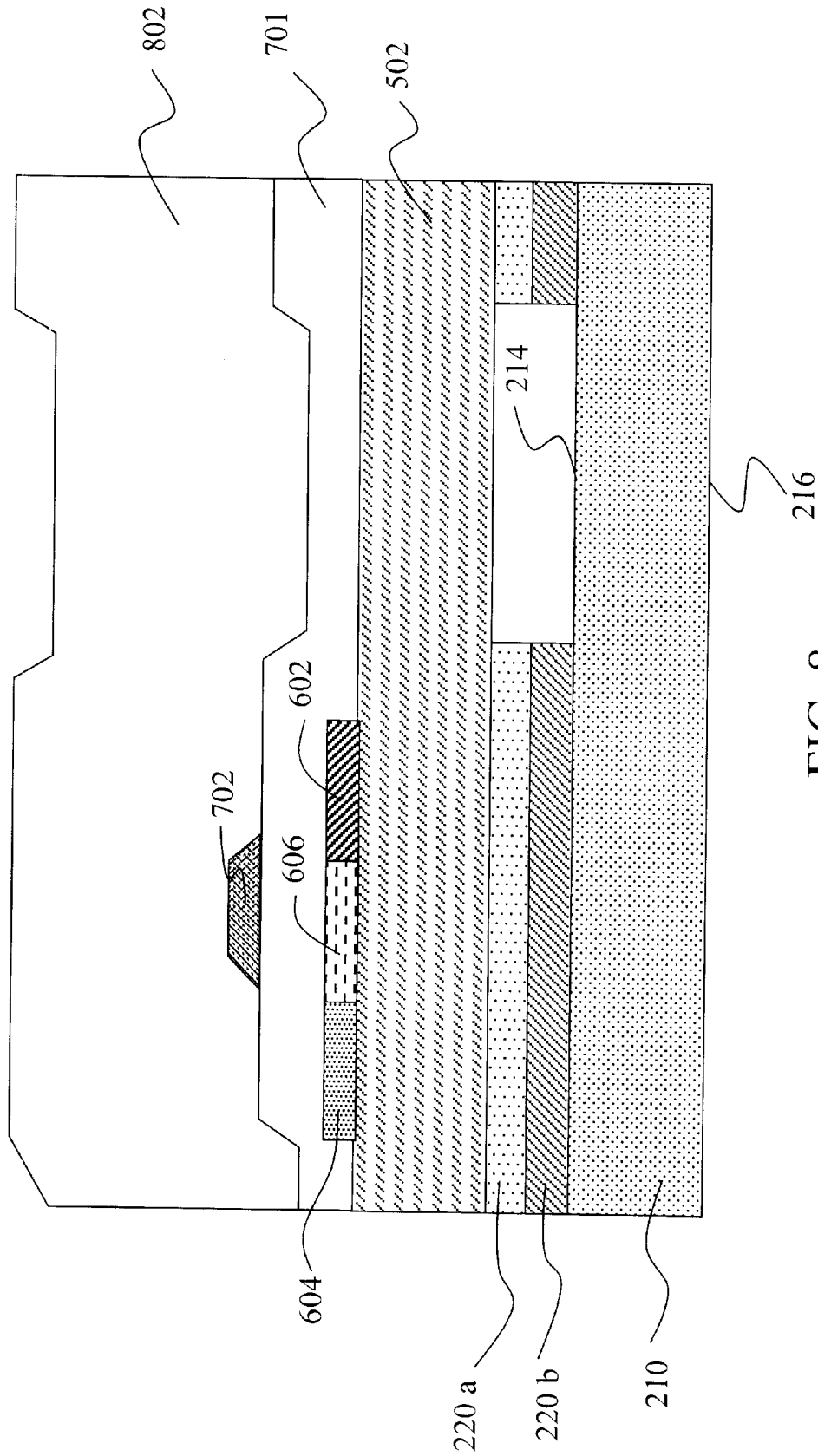
Figure 9:
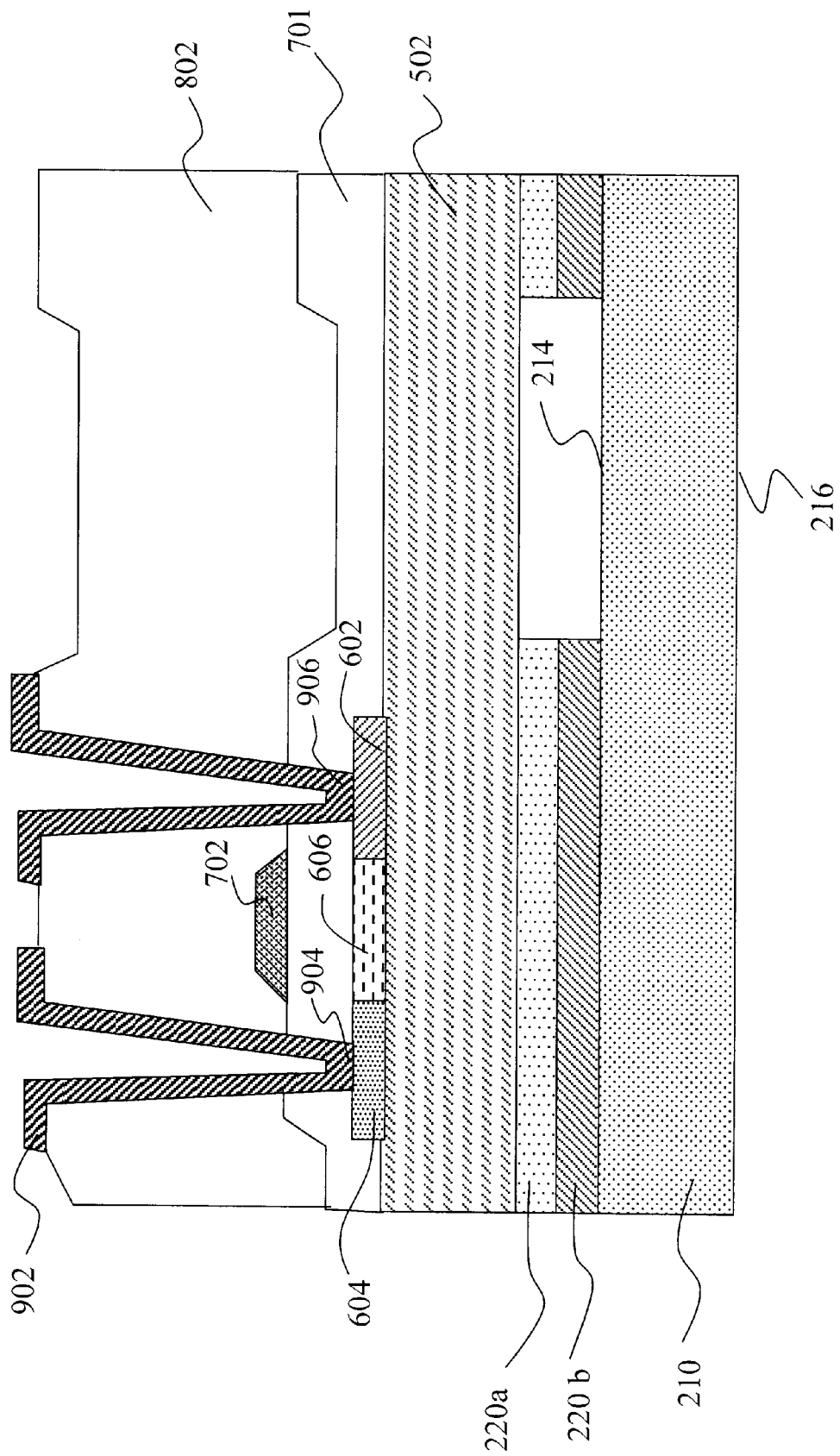

FIG. 8 is a cross-sectional view taken along the line B-B' in FIG. 2 illustrating the interlayer process of the full-color OLED display device according to the invention. In this process, an interlayer 802 is deposited over the gate layer and the polycrystalline silicon island. Then, two contact holes 904 and 906 are made and a metal layer 902 is covered over the interlayer 802. The source and drain electrodes are deposited by definition. The result is shown in FIG. 9.

Figure 1A:
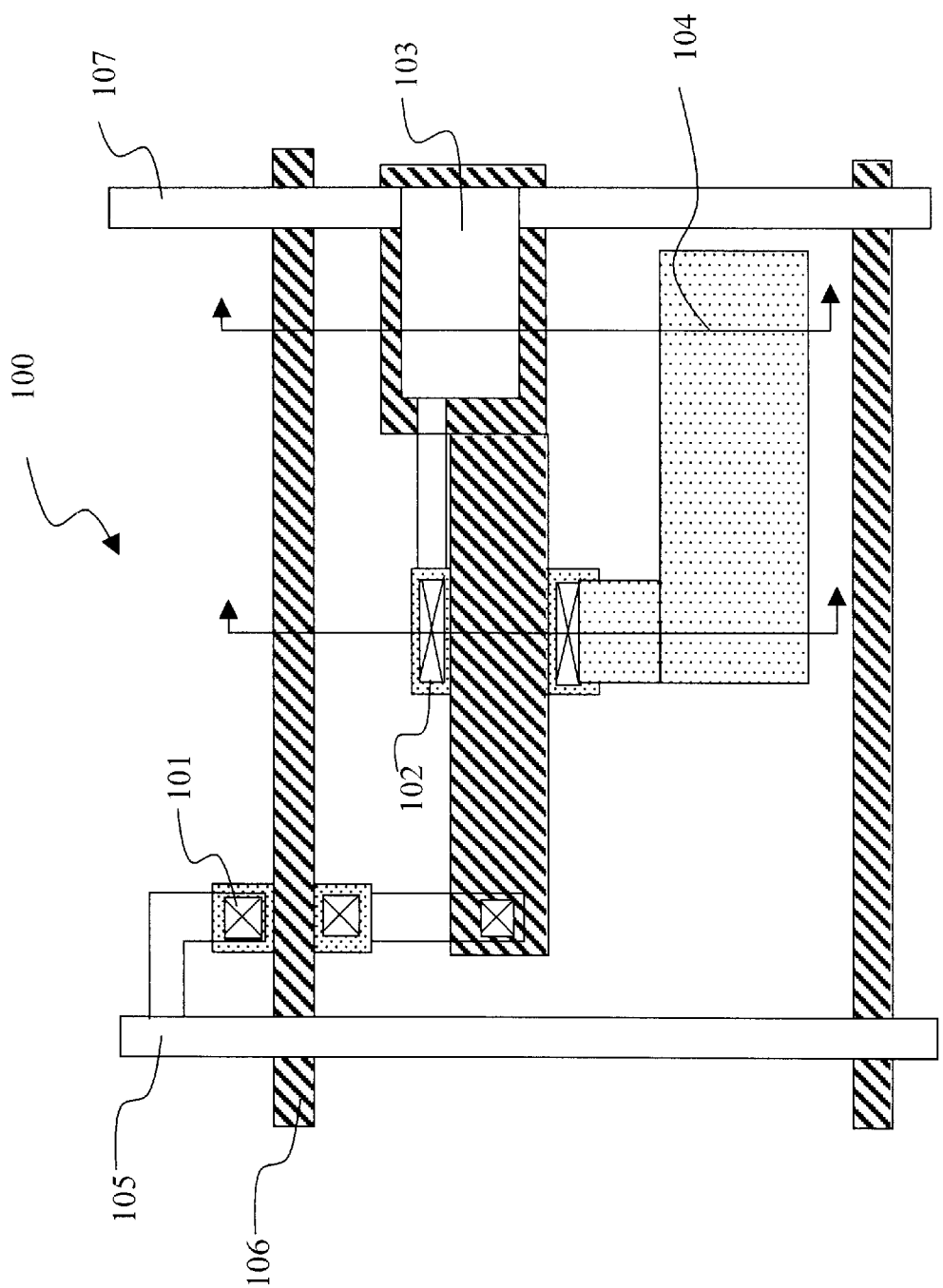
FIG. 1a shows a diagrammatic plan view of a conventional TFT-OEL device.
Figure 1B:
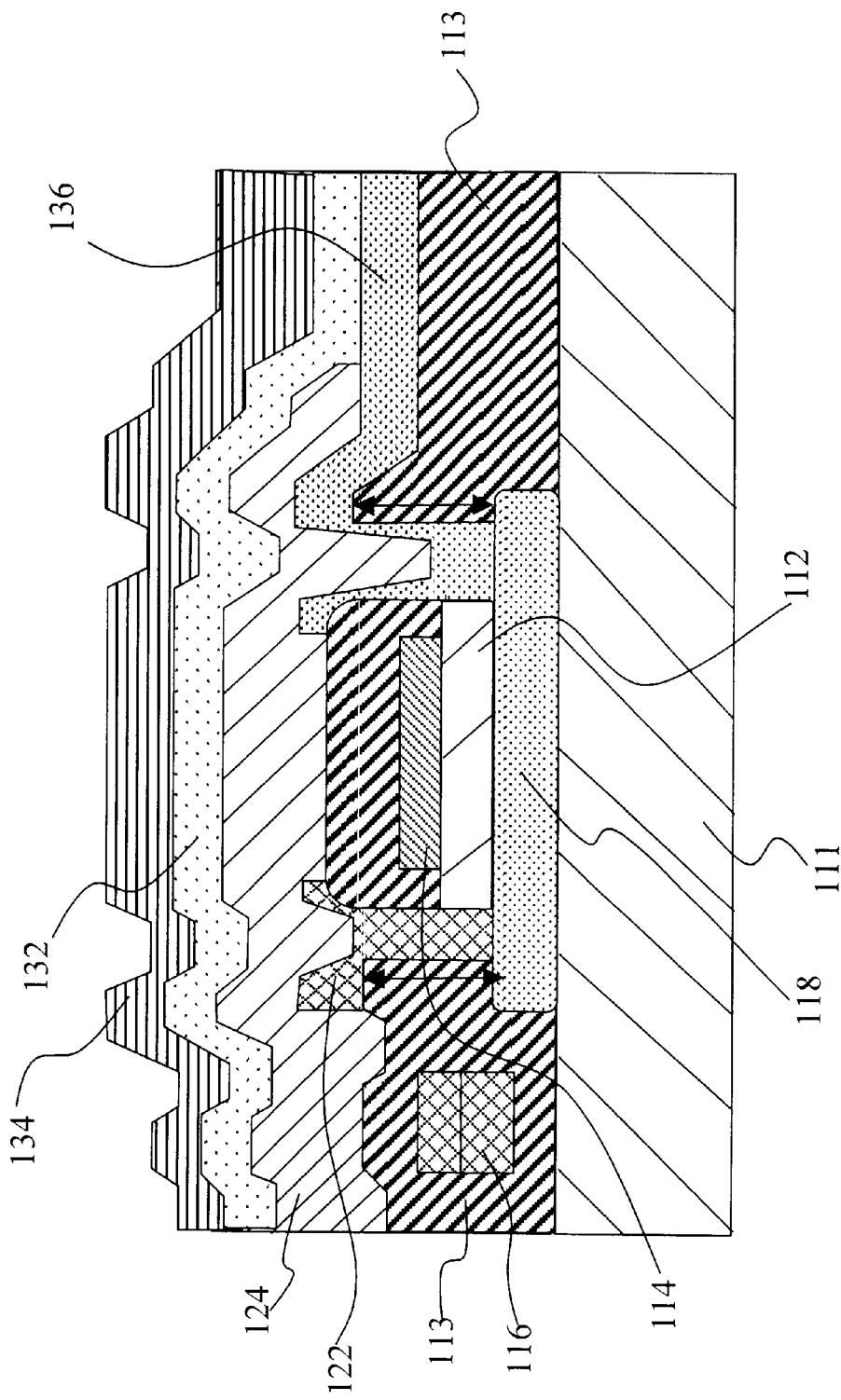
FIG. 1b is a cross-sectional view of FIG. 1a, illustrating the process of forming a pixel structure of a conventional TFT-OEL device.
Figure 10:
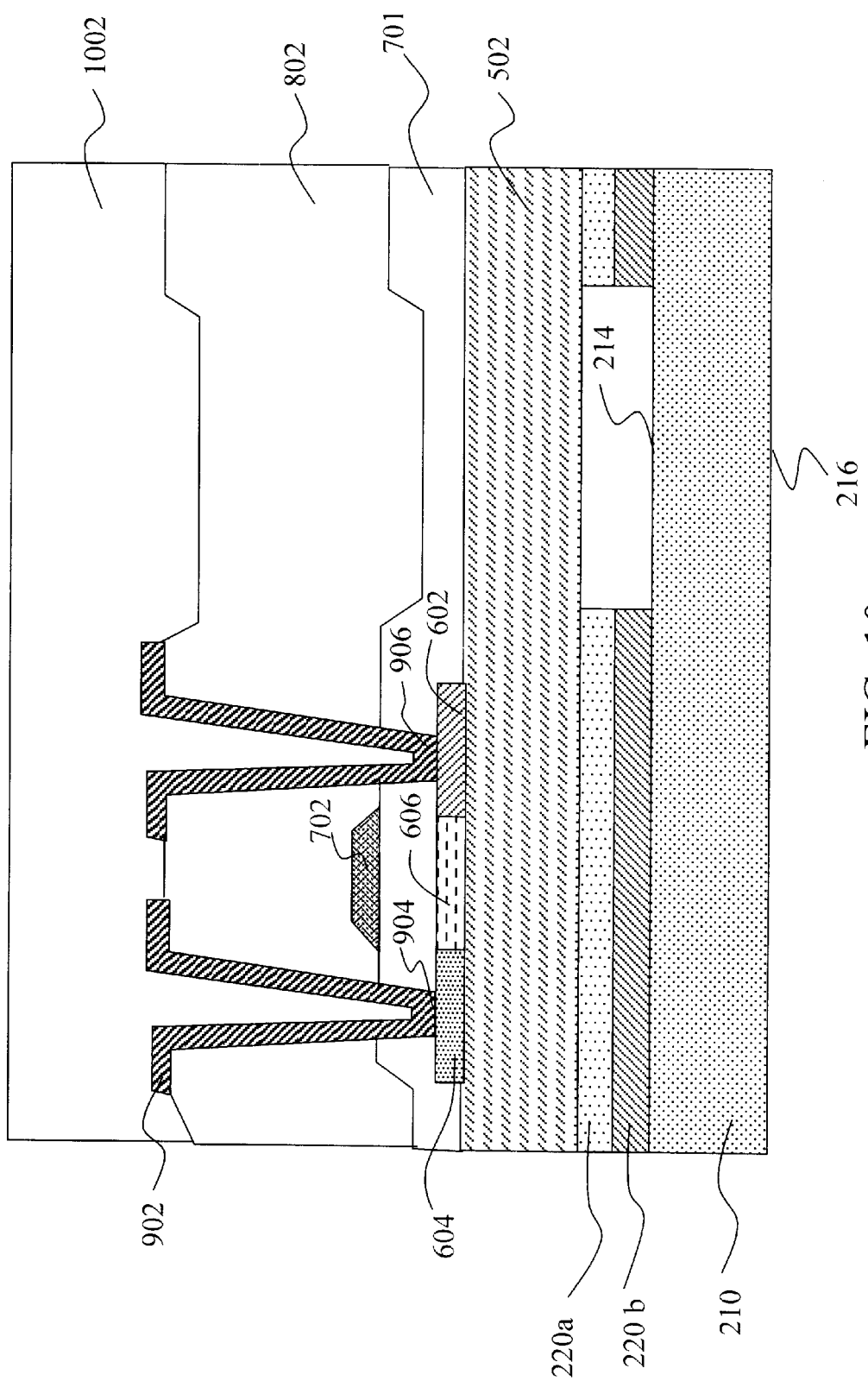
Figure 11:
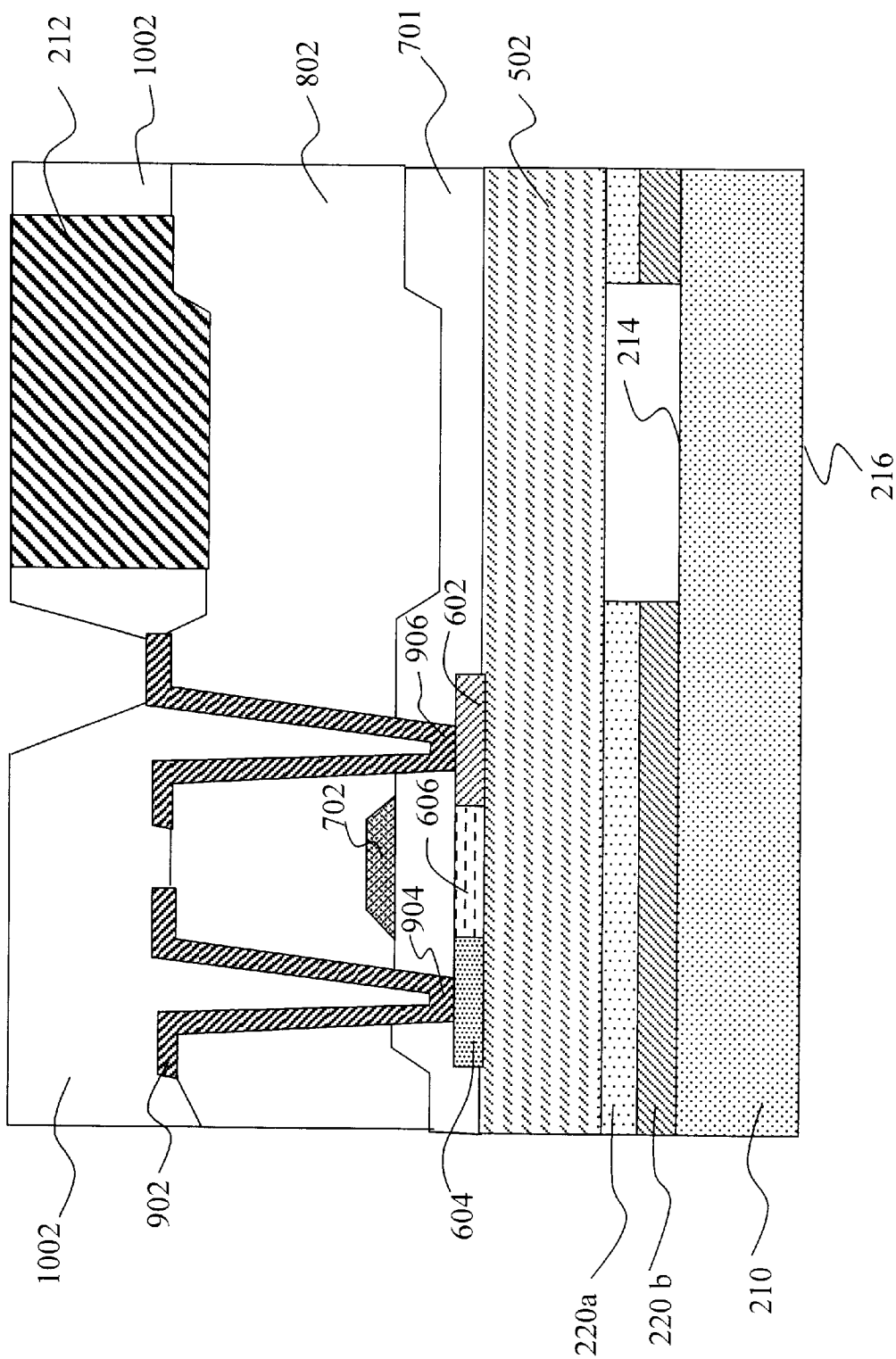
Figure 12:
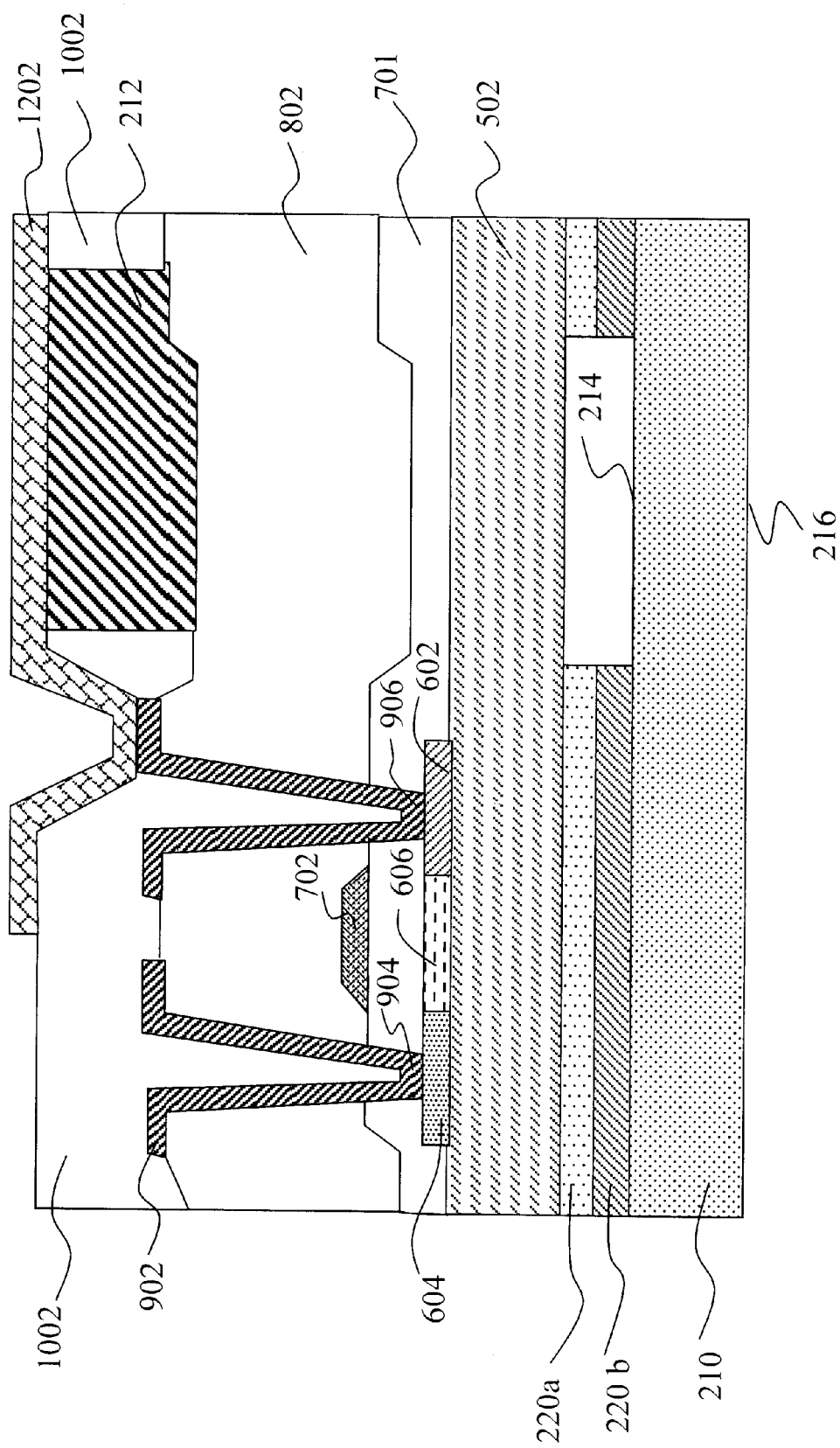

Then, a passivation layer 1002 is covered on the metal layer 902, as shown in FIG. 10. The passivation layer 1002 may be made of photosensitive resin material or non-photosensitive resin material. A portion of the passivation layer 1002, the region of the color filter 212 and the drain electrode of the thin film transistor $T_2$, are etched after exposure and development using a photo mask pattern by a standard photolithography process. Then, a layer of color filter made of photosensitive resin type is coated on the interlayer 802 by a standard photolithography process to define a color filter 212. The result is shown in FIG. 1 1. After this step, a transparent layer 1202, such as indium-tin-oxide (ITO), is deposited over the passivation layer 1002, the color filter 212 and the whole surface of the device. The transparent layer is defined as an anode layer and is electrically connected to the drain electrode of the thin film transistor $T_2$. The result is shown in FIG. 12.

Figure 13:
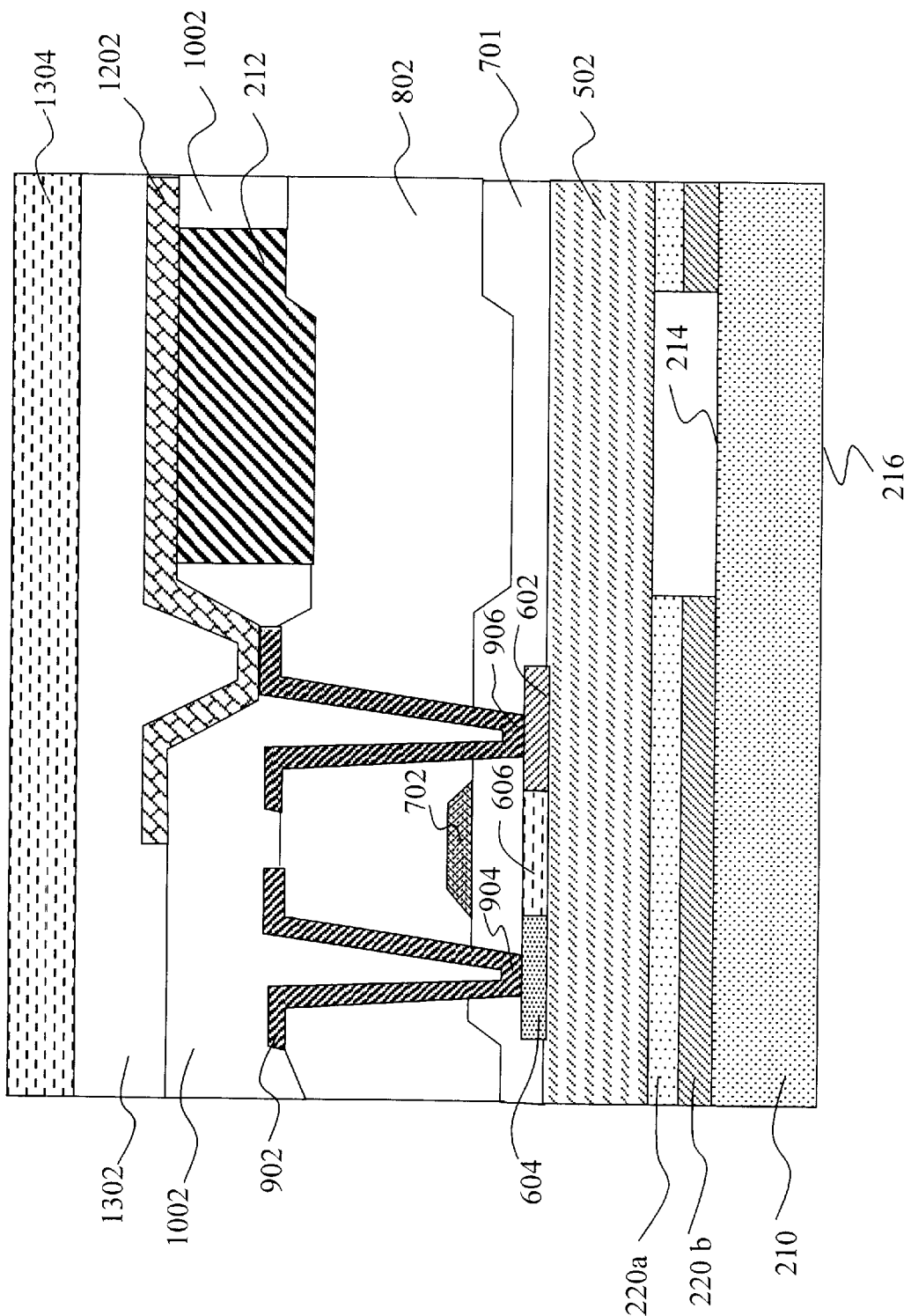
FIG. 13 is a cross-sectional view taken along the line B-B' in FIG. 2 illustrating the OLED deposition process of the full-color OLED display device according to the invention.

FIG. 13 is a cross-sectional view taken along the line B-B' in FIG. 2 illustrating the OLED deposition process of the full-color OLED display device according to the invention. In this process, an OLED layer 1302 is deposited over the ITO layer 1202 and the passivation layer 1002. Finally, a cathode metal layer 1304 is deposited over the OLED layer 1302, such as an electrode layer of lithium (Li) or aluminum (Al). In the preferred embodiments, the OLED layer employs white organic light-emitting diodes or polymer light-emitting diodes as the electroluminescent media.

FIG. 14 is a cross-sectional view taken along the line A-A' in FIG. 2, where numeral 1402 represents an N+type doping polysilicon region. The polysilicon regions on the left-hand and right-hand sides of poly-si layer 606 are used as the drain electrode and the source electrode regions, respectively.

In the preferred embodiments, a white OEL device is used to emit light. A light then passes a color filter to get red, green or blue color of light. Therefore, a full-color OLED is formed. Because the OLED device structure and the color filter are integrated in a thin-film-transistor array, the process is simple. In addition, a black matrix is deposited outside the color filter region and under the thin film transistor $T_2$ in order to reduce the leakage of light and increase the contrast of the display device. Therefore, the advantages of the active matrix full-color OLED display device of the invention include simple fabricating process, high-resolution, high lighting efficiency and wide viewing angle.

Although this invention has been described with a certain degree of particularity, it is to be understood that the present disclosure has been made by way of preferred embodiments only and that numerous changes in the detailed construction and combination as well as arrangement of parts may be restored to without departing from the spirit and scope of the invention as hereinafter set forth.

What is claimed is:
1. A pixel structure of an organic light-emitting diode (OLED) display device comprising:
a substrate having top and bottom surfaces;
a first thin film transistor having a source electrode, a drain electrode and a gate electrode, said source electrode of said first thin film transistor being electrically connected to a data line, and said gate electrode comprising a portion of a gate line; a second thin film transistor having a source electrode, a drain electrode and a gate electrode, said gate electrode of said second thin film transistor being electrically connected to said drain electrode of said first thin film transistor;
a storage capacitor, said storage capacitor being connected in series with said first thin film transistor and being electrically connected to said gate electrode of said second thin film transistor;
a color filter being formed in the pixel region of said display device;
a black matrix region being deposited under said second thin film transistor and outside said color filter region to reduce the leakage of light and increase the contrast of said display device; and
an OLED device structure comprising an anode electrode layer and a cathode metal layer and being constructed on the top surface of said substrate, said anode electrode of said OLED device structure being electrically connected to said drain electrode of said second thin film transistor and being connected in series with said second thin film transistor, via said color filter to get red, green and blue colors of light to form said OLED device of full color;
wherein said black matrix region are deposited over the top surface of said substrate, said first and second thin film transistors, said storage capacitor and said color filter are all formed above said black matrix region and below said OLED device structure.

2. The pixel structure of an OLED display device as claimed in claim 1, wherein said OLED device structure uses white organic light-emitting diodes or polymer light-emitting diodes as the electroluminescent media.

3. The pixel structure of an OLED display device as claimed in claim 1, wherein said second thin film transistor is a poly-silicon thin film transistor and is used to provide current to said OLED device structure.

4. The pixel structure of an OLED display device as claimed in claim 1, wherein second thin film transistor is used to serve as an active drive device.

5. The pixel structure of an OLED display device as claimed in claim 1, said black matrix region further comprising a metal layer, and a chromium oxide layer or a black resin layer.

6. The pixel structure of an OLED display device as claimed in claim 1, said anode electrode layer of said OLED device structure further comprising a layer of indium-tin-oxide.

7. The pixel structure of an OLED display device as claimed in claim 1, said cathode metal layer of said OLED device structure further comprising an electrode layer of lithium or aluminum.

8. The pixel structure of an OLED display device as claimed in claim 1, wherein said substrate is a transparent insulating substrate.

* * * * *